(12) United States Patent
Kloster et al.

(10) Patent No.: US 6,734,094 B2
(45) Date of Patent: May 11, 2004

(54) METHOD OF FORMING AN AIR GAP WITHIN A STRUCTURE BY EXPOSING AN ULTRAVIOLET SENSITIVE MATERIAL TO ULTRAVIOLET RADIATION

(75) Inventors: Grant M. Kloster, Lake Oswego, OR (US); Jihperng Leu, Portland, OR (US); Hyun-Mog Park, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 88 days.

(21) Appl. No.: 10/134,264

(22) Filed: Apr. 29, 2002

(65) Prior Publication Data

US 2003/0203592 A1 Oct. 30, 2003

(51) Int. Cl.[7] ............................................. H01L 21/764
(52) U.S. Cl. ........................ 438/619; 438/411; 438/421
(58) Field of Search ........................... 438/411, 421, 438/422, 619

(56) References Cited

U.S. PATENT DOCUMENTS

| | | | | |
|---|---|---|---|---|
| 6,261,942 B1 | * | 7/2001 | Zhou et al. ................. | 438/421 |
| 6,306,753 B1 | * | 10/2001 | Anand et al. ................ | 438/421 |
| 6,306,754 B1 | * | 10/2001 | Agarwal ...................... | 438/421 |
| 6,313,046 B1 | * | 11/2001 | Juengling et al. ........... | 438/421 |
| 6,376,893 B1 | * | 4/2002 | Rha ............................. | 438/422 |
| 6,406,975 B1 | * | 6/2002 | Lim et al. .................... | 438/421 |
| 6,413,827 B2 | * | 7/2002 | Farrar ......................... | 438/421 |
| 6,498,070 B2 | * | 12/2002 | Chang et al. ................ | 438/421 |
| 6,610,593 B2 | * | 8/2003 | Kohl et al. .................. | 438/623 |

FOREIGN PATENT DOCUMENTS

JP  02-170423  *  7/1990  ........... H01L/21/28

* cited by examiner

*Primary Examiner*—Wael Fahmy
*Assistant Examiner*—Anh Duy Mai
(74) *Attorney, Agent, or Firm*—Trop, Pruner & Hu, P.C.

(57) ABSTRACT

An ultraviolet sensitive material may be formed within a semiconductor structure covered with a suitable hard mask. At an appropriate time, the underlying ultraviolet sensitive material may be exposed to ultraviolet radiation, causing the material to exhaust through the overlying hard mask. As a result, an air gap may be created having desirable characteristics as a dielectric.

17 Claims, 4 Drawing Sheets

US 6,734,094 B2

METHOD OF FORMING AN AIR GAP WITHIN A STRUCTURE BY EXPOSING AN ULTRAVIOLET SENSITIVE MATERIAL TO ULTRAVIOLET RADIATION

BACKGROUND

This invention relates generally to the fabrication of integrated circuits and, particularly, to the fabrication of integrated circuits with extremely low dielectric constants.

Low dielectric constant materials are used as interlayer dielectrics in semiconductor devices to reduce the RC delay and improve device performance. As device sizes continue to shrink, the dielectric constant of the material between metal lines must also decrease to maintain the improvement. The eventual limit for dielectric constant is k=1, which is the value for a vacuum. This can only be obtained by producing a void space between metal lines, equivalent to creating a so-called air gap. The air itself has a dielectric constant very near 1.

One major issue facing air gap technology is how to remove sacrificial material to facilitate multi-layer structures. Plasmas may be destructive to the metal lines. Wet etches have many problems including capillary forces that can break the lines apart, difficulty in removing material from small features, and difficulty in removing the wet etch chemical once it has been introduced. Thermal decomposition presents a challenge in that the sacrificial material must remain stable during high temperature fabrication steps, but then decompose rapidly at temperatures that will not destroy the rest of the device.

Thus, there is a need for better ways to form openings within integrated circuits.

DETAILED DESCRIPTION

Figure 1:
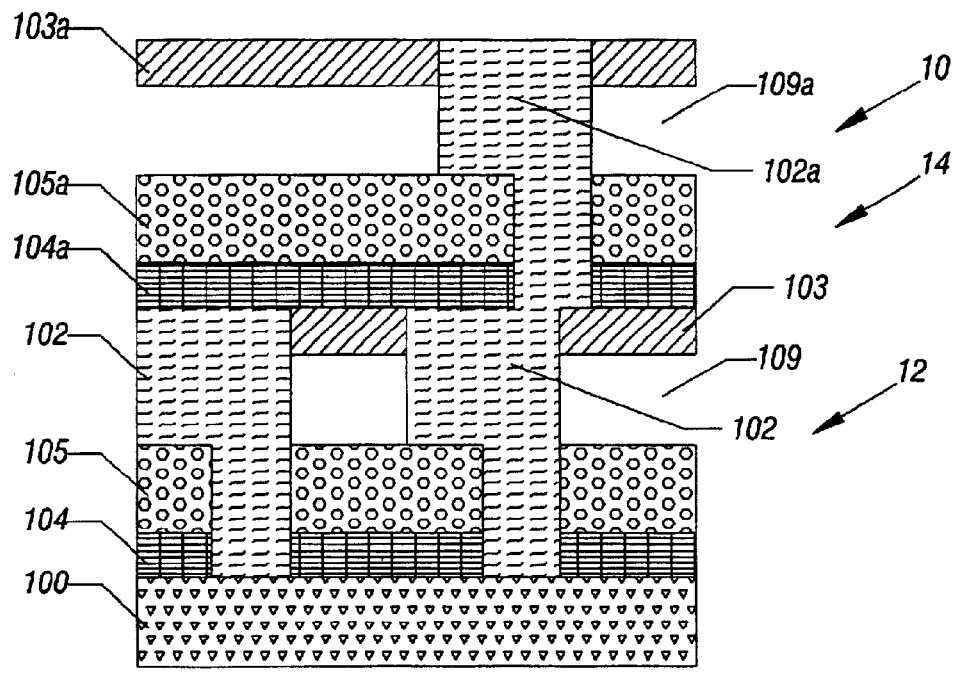
FIG. 1 is an enlarged cross-sectional view of one embodiment of the present invention.

Referring to FIG. 1, a multilevel integrated circuit device 10, according to one embodiment of the present invention, includes a first level 12 that includes a substrate 100, an ultraviolet absorbing etch stop/diffusion layer 104, a via-level interlayer dielectric 105, open areas or air gaps 109, metal lines 102, and a hard mask 103.

A second layer 14 may include a via-level interlayer dielectric 105a, an air gap 109a, a metal line 102a, and a hard mask 103a. Of course, additional layers may be used in some embodiments of the present invention.

As indicated in FIG. 1, the air gaps 109, 109a may be formed within the semiconductor structure. These air gaps then provide a very low dielectric constant close to or equal to one in some embodiments of the present invention. Thus, the air gaps 109 isolate between lines in the same layer, reducing line-to-line capacitance and, therefore, cross-talk and RC delays.

Figure 2:
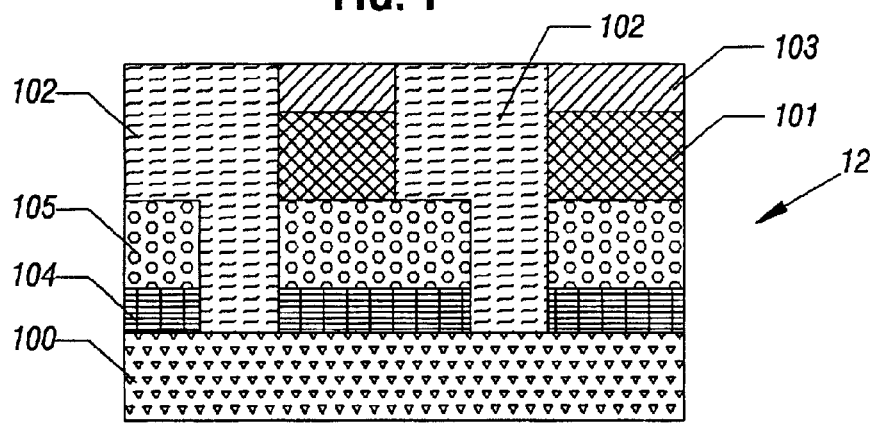
FIG. 2 is an enlarged cross-sectional view at an early stage of manufacturing the embodiment as shown in FIG. 1 in accordance with one embodiment of the present invention.

The manufacture of the device 10, shown in FIG. 1, may begin with the layer 12 as indicated in FIG. 2 in one embodiment. An ultraviolet absorbing etch stop/diffusion layer 104 may be formed on a semiconductor substrate 100. A via-level interlayer dielectric may be formed over the etch stop/diffusion layer 104. An ultraviolet sensitive sacrificial material 101 may be formed on top of the dielectric 105. The material 101 may be a polyketoester, polyketoamide, or any other material that decomposes readily upon exposure to ultraviolet light. For example, the material 101 may be polyketoester-polyphenylene or polyketoamide-polyphenylene block copolymer.

Ultraviolet light decomposes polymers that contain certain ketone groups. In one embodiment, the material 101 may include the ketone groups incorporated into a cross-linked aromatic polymer to produce a thermally stable material that is susceptible to degradation by ultraviolet light. Additionally, oxygen may be used in combination with ultraviolet light to aid decomposition through oxidation by $O_2$ or ozone. Ozone is a powerful oxidant that is formed when ultraviolet light interacts with $O_2$.

The hard mask 103 may be formed on top of the material 101. The hard mask 103 may be porous or non-porous. The resulting structure is then patterned and etched to form metal lines 102 as indicated in FIG. 2. The structure shown in FIG. 2 may be described as a dual damascene structure which forms the layer 12 of FIG. 1.

Figure 3:
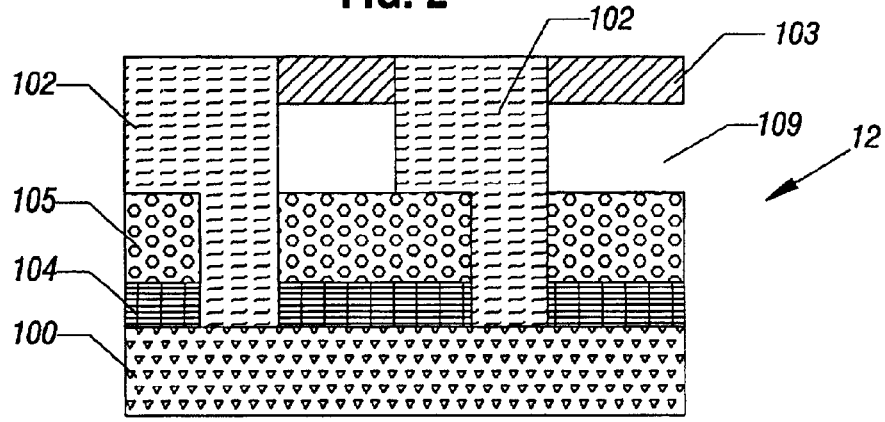
FIG. 3 is an enlarged cross-sectional view at a subsequent stage of manufacture in accordance with one embodiment of the present invention.

Moving to FIG. 3, the sacrificial material 101 is removed through the hard mask 103 by exposing the structure 12 to ultraviolet light. This may be done in the presence of $O_2$ in some embodiments. This results in the formation of the air gaps 109. In some embodiments, the destabilized material 101 exhausts through the hard mask 103 which may be porous in some embodiments. In other embodiments, suitable openings may be provided to exhaust the decomposed material.

Figure 4:
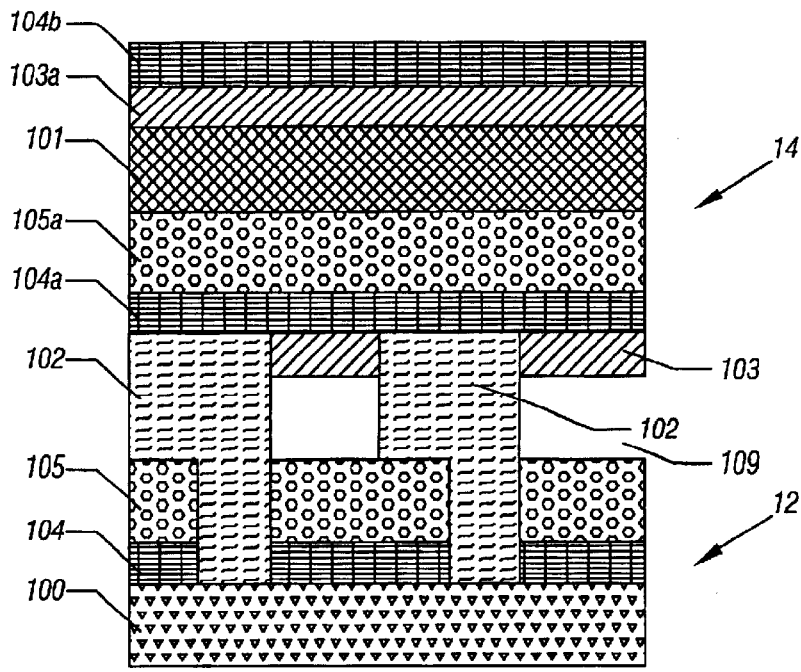
FIG. 4 is an enlarged cross-sectional view at a subsequent stage of manufacture in accordance with one embodiment of the present invention.

Turning to FIG. 4, atop the layer 12 is the ultraviolet absorbing etch stop/diffusion barrier 104a, the via-level interlayer dielectric 105a, the ultraviolet sensitive sacrificial material 101, the hard mask 103a, and the ultraviolet absorbing etch stop/diffusion layer 104b that form the upper layer 14 in accordance with one embodiment of the present invention. The light absorbing layer 104b protects the sacrificial material 101 during patterning of the upper layer 14.

Figure 5:
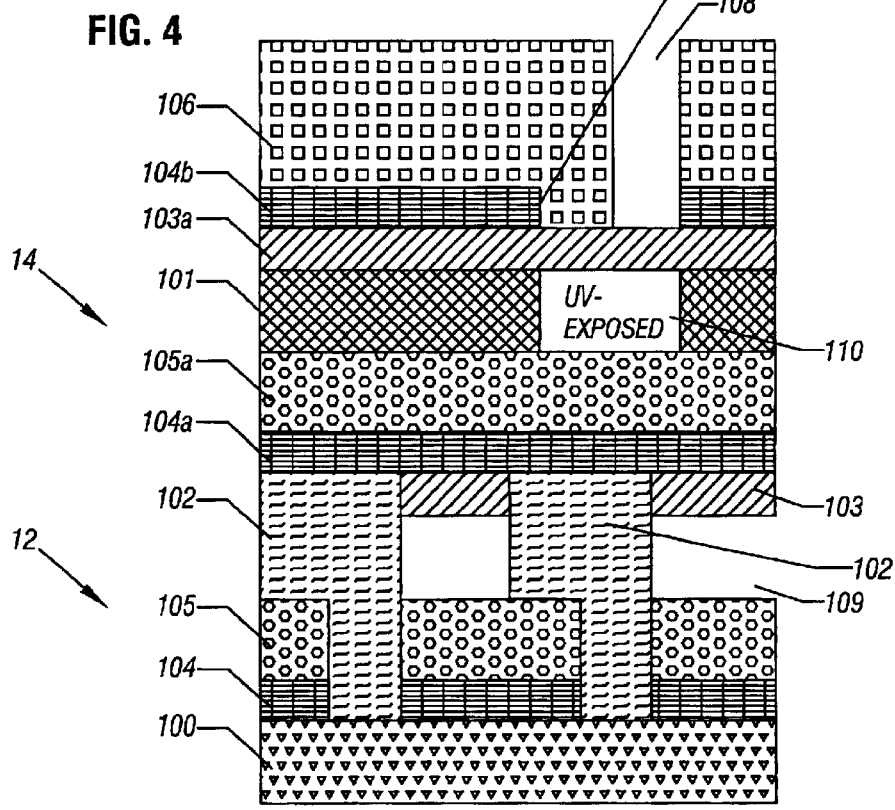
FIG. 5 is an enlarged cross-sectional view at a subsequent stage of manufacture in accordance with one embodiment of the present invention.

As shown in FIG. 5, an opening 111 is patterned in the etch stop/diffusion layer 104b. Then, the photoresist 106 is deposited, filling the trench 111 formed in the etch stop/diffusion layer 104b. Next, the photoresist 106 is patterned and removed to form the trench 108. As indicated at 110, some of the sacrificial material 101 is exposed to the ultraviolet light during photolithography. However, the material 110 will be removed completely during a subsequent trench etch anyway.

The hard mask 103a is not light absorbing since sacrificial material 101 would be removed through it in subsequent steps. The hard mask 103a remains for mechanical support of upper layers. Through the imposition of the layers 105a and 104b, the region 110 is appropriately shaped to be part of a larger area that must be entirely removed when an L-shaped metal line 102 is formed through the material 101 and the layers 105a and 104b.

Figure 6:
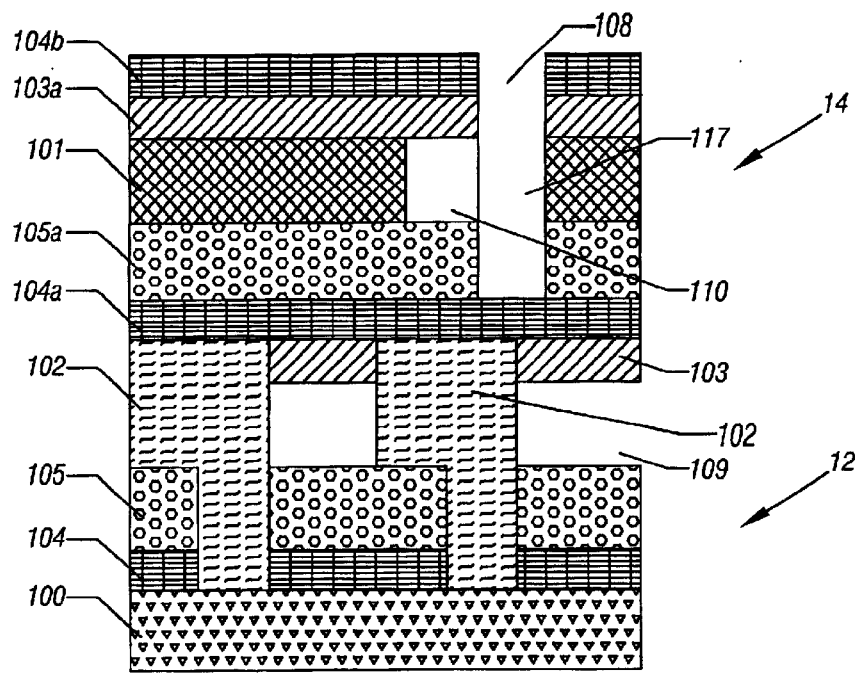
FIG. 6 is an enlarged cross-sectional view at a subsequent stage of manufacture in accordance with one embodiment of the present invention.
Figure 7:
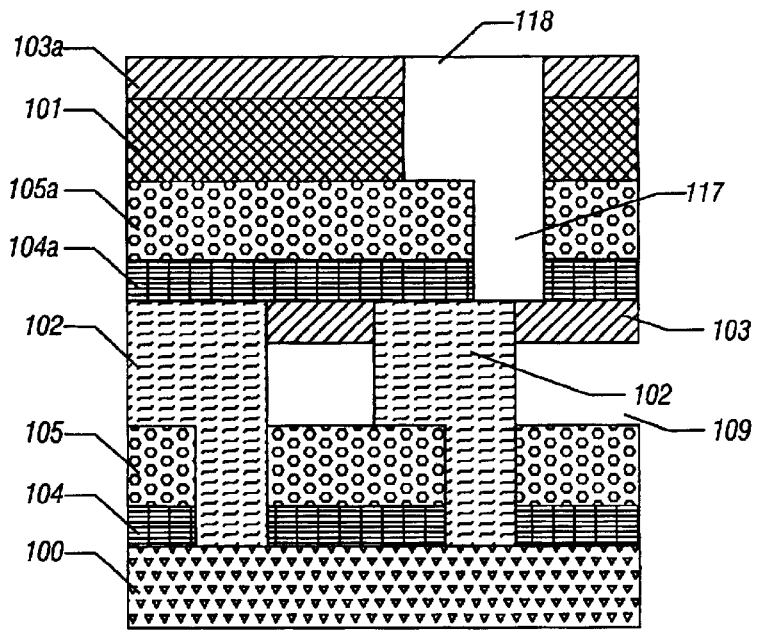
FIG. 7 is an enlarged cross-sectional view at a subsequent stage of manufacture in accordance with one embodiment of the present invention.
Figure 8:
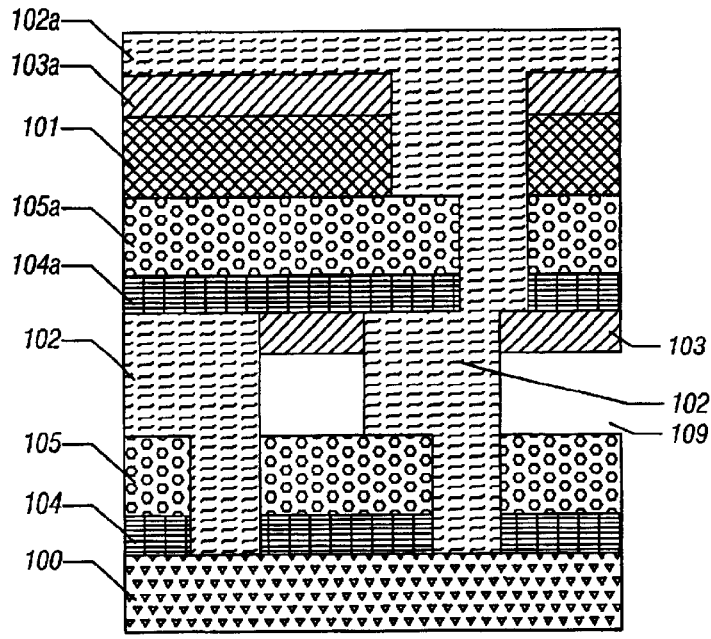
FIG. 8 is an enlarged cross-sectional view at a subsequent stage of manufacture in accordance with one embodiment of the present invention.

As shown in FIG. 6, the trench 108 is utilized to expose an additional region 117 which is then etched all the way down to the etch stop/diffusion barrier 104a thereafter. The resulting trench 117 is caused to extend through the hard mask 103a through the exposed portion 110, the layer 105a, and stopping on the etch stop/diffusion barrier 104a. Next, the photoresist is removed. An etch is done which widens the opening 117 just created by extending through the hard mask 103a and the rest of the exposed material 110 stopping on the layer 104a, as shown in FIG. 7. An etch is also done through the hard mask 104a. As shown in FIGS. 7 and 8, this creates an L-shaped opening for the metal line 102a having a wider upper portion 118 and a narrower lower portion 117.

Next, the metal 102a is deposited to fill the opening portions 117 and 118, overlying the top of the layer 103a, as shown in FIG. 8. In one embodiment, the metal may be copper. Thus, a barrier, seed, and copper may be deposited in one embodiment of the present invention.

Figure 9:
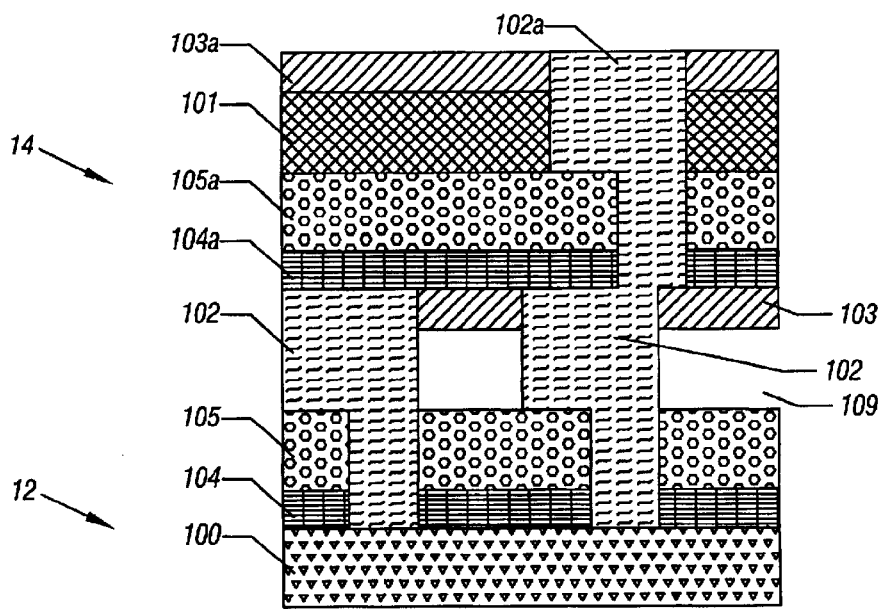
FIG. 9 is an enlarged cross-sectional view at a subsequent stage of manufacture in accordance with one embodiment of the present invention.

Referring to FIG. 9, following a chemical mechanical planarization, in accordance with one embodiment of the present invention, the metal line 102a is formed generally having an upper surface coincident with the upper surface of the hard mask 103a. Then, the sacrificial material 101 is removed through the hard mask 103a by exposing it to ultraviolet light to form the structure shown in FIG. 1.

In some embodiments of the present invention, the sacrificial materials are more stable toward normal thermal processing in device fabrication than those utilized in connection with thermally decomposing material. Plasma exposure to metal lines may be avoided. There are no issues from wet etching such as capillary action and surface tension.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

forming an ultraviolet sensitive material within a semiconductor structure;

exposing said material to ultraviolet radiation; and causing said material to be removed through said structure.

2. The method of claim 1 including covering said ultraviolet sensitive material with an overlaying layer.

3. The method of claim 2 including covering said ultraviolet sensitive material with a hard mask.

4. The method of claim 1 where causing said material to be removed through said structure includes covering said material with a porous layer and causing said material to pass as a gas through said porous layer.

5. The method of claim 1 including forming a region having a dielectric constant of approximately one.

6. The method of claim 5 including removing said material through said structure to create an enclosed air gap.

7. The method of claim 6 including exposing a portion of said ultraviolet sensitive material that is not intended to become an air gap and removing said exposed material.

8. The method of claim 7 including filling the region where the exposed material was removed with another material.

9. The method of claim 1 including forming a multi-layer structure, and removing ultraviolet sensitive material within each of said layers.

10. The method of claim 8 including removing the ultraviolet sensitive material by exposing said material to ultraviolet radiation and thereafter applying a subsequent layer containing ultraviolet sensitive material and thereafter removing the ultraviolet sensitive material from the subsequent layer.

11. A method comprising:

forming an ultraviolet sensitive material within a semiconductor structure;

exposing said material to ultraviolet radiation;

enabling said material to be removed through said structure; and forming an air gap where said material exposed to ultraviolet radiation was formed.

12. The method of claim 11 including covering said ultraviolet material with an overlying layer.

13. The method of claim 12 including covering said ultraviolet sensitive material with a hard mask.

14. The method of claim 11 wherein enabling said material to be removed through said structure includes covering said material with a porous layer and enabling said material to pass as a gas through said porous layer.

15. The method of claim 11 including exposing a portion of said ultraviolet material that is not intended to become an air gap and removing said exposed material.

16. The method of claim 15 including filling the region where the exposed material was removed with another material.

17. The method of claim 11 including forming a multi-layer structure and removing ultraviolet sensitive material within each of said layers.

* * * * *